(12) United States Patent
Duclos

(10) Patent No.: US 6,559,515 B1
(45) Date of Patent: May 6, 2003

(54) INSULATING WALL BETWEEN POWER COMPONENTS

(75) Inventor: Franck Duclos, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/391,636

(22) Filed: Sep. 7, 1999

(30) Foreign Application Priority Data

Sep. 16, 1998 (FR) .............................................. 98 11714

(51) Int. Cl.$^7$ .......................... H01L 29/00; H01L 29/74; H01L 31/111
(52) U.S. Cl. ........................ 257/502; 257/544; 257/547; 257/119; 257/146
(58) Field of Search .................................. 257/391, 547, 257/544, 503, 929, 500, 146, 502, 119, 548, 549

(56) References Cited

U.S. PATENT DOCUMENTS

| | | | |
|---|---|---|---|
| 3,649,887 A | | 3/1972 | Keller et al. ............. 317/235 R |
| 3,795,846 A | * | 3/1974 | Ogawa et al. ................ 257/502 |
| 3,982,269 A | * | 9/1976 | Torreno, Jr. et al. ........ 257/500 |
| 5,488,247 A | * | 1/1996 | Sakurai ....................... 257/548 |
| 5,892,268 A | * | 4/1999 | Yashita et al. ............... 257/544 |

FOREIGN PATENT DOCUMENTS

| | | | |
|---|---|---|---|
| EP | A-0 721 218 | 7/1996 | ................. 257/502 |
| EP | A-0 791 962 | 8/1997 | ................. 257/502 |
| JP | 57-21862 * | 2/1982 | ................. 257/119 |

OTHER PUBLICATIONS

Patent Abstracts of Japan, vol. 095, No. 006, Jan. 30, 1995 & JP–A–07 037976 (Fujitsu Ltd.).
Patent Abstracts of Japan, vol. 008, No. 013 (E–222), Jan. 20, 1984 & JP–A–58 175845 (Mitsubishi Denki KK).
European Search Report from EP 99 41 0113, which application corresponds to present application.
Yatuso T., et al., *A Diode Integrated High Speed Thyristor*, Japanese Journal of Applied Physics, Supplements, Ja, Japan Society of Applied Physics, Tokyo, vol. 40, pp 99–104, XP002055120.
Patent Abstracts of Japan, vol. 095, No. 006, Jun. 30, 1995 & JP–A–07 037976 (Fujitsu Ltd.).
Patent Abstracts of Japan, vol. 008, No. 013 (E–222), Jan. 20, 1984 & JP–A–58 175845 (Mitsubishi Denki KK).

* cited by examiner

*Primary Examiner*—Steven Loke
(74) *Attorney, Agent, or Firm*—Wolf, Greenfield & Sacks, P.C.; James H. Morris

(57) ABSTRACT

An insulating wall of a second conductivity type intended for separating elementary components formed in different wells of a semiconductive layer of a first conductivity type, a component located in one at least one of the wells being capable of operating with a high current density. The insulating wall includes at least two elementary insulating walls separated by a portion of the wafer material and, in operation, this portion is connected to a reference potential.

10 Claims, 3 Drawing Sheets

INSULATING WALL BETWEEN POWER COMPONENTS

BACKGROUND OF THE INVENTION

1. Field of the Invention

The present invention relates to semiconductor power components, that is, components capable of switching high currents and/or withstanding high voltages.

2. Discussion of the Related Art

Conventionally, power and/or high voltage components used to be discrete components. To ensure the lateral insulation of the components and improve their breakdown voltage, the component periphery is formed of an insulating wall formed by deep diffusion of dopant atoms from the upper and lower surfaces of a silicon wafer, the cutting being formed in the middle of this insulating wall.

With the development of technology, several power components and especially several vertical components can now be manufactured in the same chip. Examples of such structures are described in patent application EP-A-0721218 of the applicant (inventor R. Pezzani) which will be considered herein as known. This application is incorporated herein by reference. In EP-A-0721218, as in all descriptions of components formed in wells separated by insulating walls, it is assumed that each of the components formed in a well surrounded with an insulating wall is properly insulated from adjacent components which do not influence one another.

The applicant has noted in some structures including components formed in distinct wells separated by insulating walls that the flowing of a high current through a component could have an effect upon an adjacent component. Accordingly, in unpublished French patent application No. 97/06822 filed on May 28, 1997 and incorporated herein by reference (inventors F. Duclos and F. Rami), the applicant has analyzed the problem, distinguished "static" insulation from "dynamic" insulation, and provided a modification of the insulating wall structure to solve the problem.

More specifically, the applicant has provided an insulating wall structure which has a doping level greater than $10^{16}$ atoms/cm$^3$ in its median part, at the meeting point of the deep diffusions formed from the upper and lower surfaces, and has also provided that, preferably, the median portion of the insulating wall has a lateral extension greater than the half-thickness of the wafer in which the deep diffusions are formed.

This prior solution implies, for a wafer of given thickness, to increase the duration of the diffusion annealing during the formation of the insulating walls and/or to increase the width of the insulating walls.

In the case where particularly intense currents have to flow through some wells, insulating walls having widths greater than the thickness of the semiconductive wafer have to be provided, to properly insulate the neighboring wells, which means that, in top view, the silicon surface occupied by the insulating walls becomes very large.

SUMMARY OF THE INVENTION

The present invention aims at providing an insulating wall structure such that the leakage currents between adjacent wells are particularly small.

Another object of the present invention is to provide an insulating wall structure such that the surface occupied by the insulating wall is reduced for intense currents.

To achieve these and other objects, the present invention provides an insulating wall of the second conductivity type intended for separating elementary components formed in different wells of a semiconductive wafer of a first conductivity type, a component located in one at least of the wells being likely to operate with a high current density. The insulating wall includes at least two elementary insulating walls separated by a portion of the wafer material and, in operation, this portion is connected to a reference potential.

According to an embodiment of the present invention, the width of the openings from which are formed the dopant diffusions into the upper and lower substrate surfaces is smaller than the half-thickness of the wafer.

This insulating wall applies to separating two wells containing vertical triacs.

This insulating wall applies to separating two wells, one at least of which includes a diode, a thyristor, or a vertical triac.

This insulating wall applies to a structure in which the various components are of vertical type and the semiconductive wafer includes a single rear surface metallization.

The foregoing objects, features and advantages of the present invention, will be discussed in detail in the following non-limiting description of specific embodiments in connection with the accompanying drawings.

DETAILED DESCRIPTION

As conventional in the field of the representation of semiconductor components, the various cross-sectional views are very simplified and are not drawn to scale. Those skilled in the art will know how to choose the junction depths and the lateral component dimensions according to the desired performances.

Figure 1:
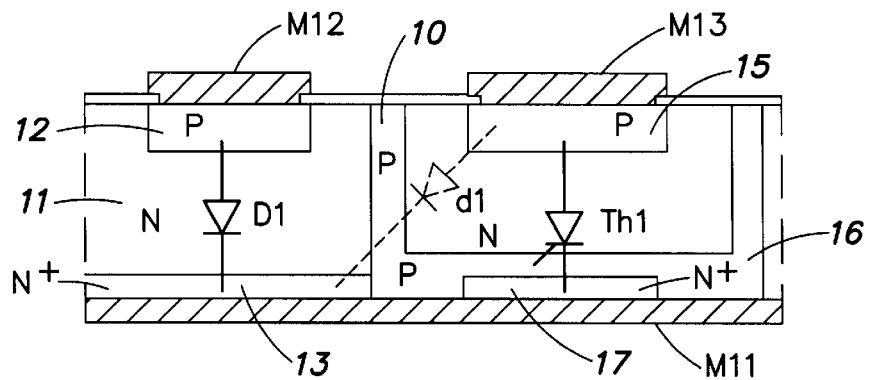
FIGS. 1 to 3 show various component assemblies and are meant to illustrate the problem that the present invention aims at solving.

FIG. 1 shows an example of association of a diode and of a thyristor with a common cathode. This drawing is extremely simplified and only those portions useful to the discussion of the present invention have been shown. Especially, the thyristor gate structure is not shown.

The left-hand portion of FIG. 1 corresponds to a vertical diode D1 and its right-hand portion corresponds to a vertical thyristor Th1 formed in a well separated from the left-hand portion by a P-type insulating wall 10. The structure is formed in an N-type substrate 11. Diode D1 includes a P-type region 12 formed on the upper surface side of the substrate and a heavily-doped N-type region 13 on the lower surface side of the substrate. Thyristor Th1 includes a P-type region 15 formed on the upper surface side of the substrate, a P-type region 16 formed on the lower surface side and an N-type region 17 formed in region 16 on the lower surface side of the substrate. The lower surface of the structure is coated with a cathode metallization M11. Region 12 is coated with an anode metallization M12 of the diode and region 15 is coated with an anode metallization M13 of the thyristor.

The conventional function of insulating wall 10 is to prevent parasitic components from appearing. Indeed, in the absence of this insulating wall, there would exist between metallizations M13 and M11 a PNN$^+$ diode d1 formed of regions 15, 11, and 13. Diode d1 would be conductive as soon as metallization M13 would be positively biased with respect to metallization M11 and would turn-on thyristor Th1 in the absence of a gate current. The presence of insulating wall 10 results in an interruption of the path through substrate 11 by two series and reverse diodes, one of which is necessarily off.

It should be noted that the parasitic effect of diode d1 occurs whatever the biasing of metallization M12 and whatever the current flowing through diode D1. It can thus be said that the insulating wall has a static voltage insulation effect.

Figure 2:
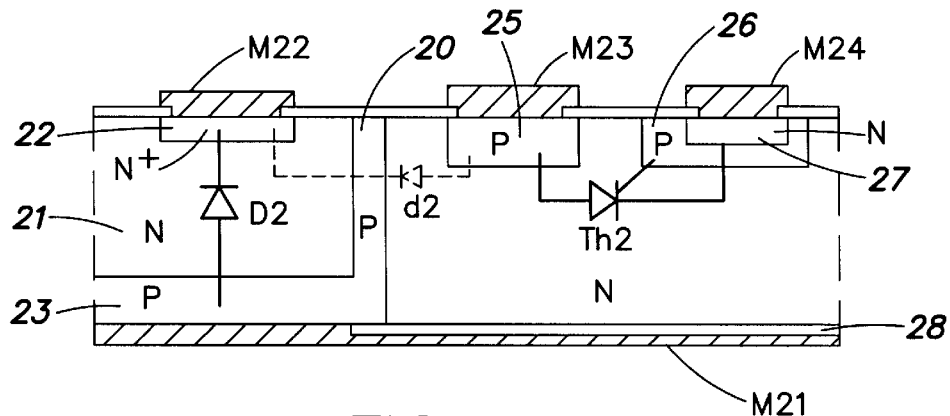

FIG. 2 shows a simplified example of a structure associating a vertical diode D2 with a lateral thyristor Th2. The two components are separated by an insulating wall 20. As in the case of FIG. 1, for clarity, the structure has been simplified and, in particular, the thyristor gate has not been shown. The structure is formed in an N-type substrate 21. Diode D2 includes on the upper surface side an N-type region 22 and on the lower surface side a P-type region 23. Thyristor Th2 includes on the upper surface side a P-type region 25 and a P-type region 26 in which is formed an N-type region 27. The N well in which the lateral thyristor is formed is coated on its lower surface side with an insulating layer 28. The lower surface is coated with an anode metallization M21 of the diode. Region 22 is coated with a cathode metallization M22 of the diode. Region 25 is coated with an anode metallization M23 of the lateral thyristor. Region 27 is coated with a cathode metallization M24 of the thyristor.

In the absence of insulating wall 20, there would exist a PNN$^+$ diode d2 between metallizations M23 and M22 and, if anode M23 of the thyristor is positively biased with respect to metallization M22, the conduction of the junction between region 25 and substrate 21 will trigger thyristor Th2 in the absence of a gate current.

Here too, the insulating wall is used to avoid the existence of a parasitic diode. Again, the insulating wall has a static voltage protection effect.

Figure 3:
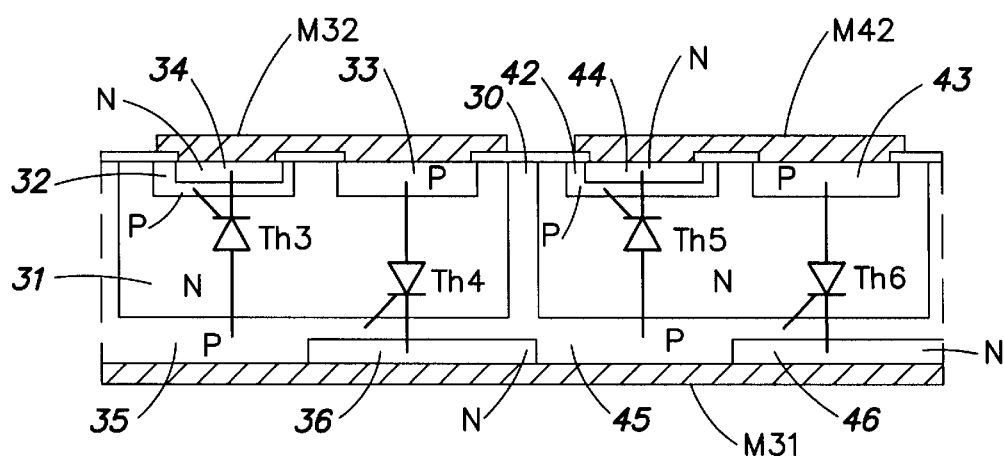

FIG. 3 schematically shows a structure associating side by side two triacs separated by an insulating wall 30 and formed in an N-type substrate 31. The left-hand triac includes head-to-tail thyristors Th3 and Th4. The right-hand triac includes head-to-tail thyristors Th5 and Th6. On the left-hand side, on the upper surface side P-type regions 32 and 33 (shown to be separated for illustration but which often form one piece) are formed on the upper surface side. In region 32 is formed an N-type region 34. On the rear surface side is formed a P-type region 35 and, in this region 35, facing region 33, an N-type region 36. On the right-hand side of the drawing, regions 42 to 46 respectively correspond to regions 32 to 36. It should be noted that regions 35 and 45 in fact form a single P-type layer. The rear surface is coated with a metallization M31. The cathode region of thyristor Th3 and the anode region of thyristor Th4 are coated with a metallization M32. The cathode region of thyristor Th5 and the anode region of thyristor Th6 are coated with a metallization M42.

In this structure, in the absence of insulating wall 30, there does not exist as in the case of the preceding drawings any parasitic diode but there are a great number of parasitic transistors capable of being turned on and to turn on one or the other of the triacs in the absence of a gate signal.

Thus, in the three preceding examples, the insulating wall has a function of static voltage protection of adjacent components. Up to now, this function has been considered as satisfactory.

The applicant has noted in the case of the triac assembly of FIG. 3 that, although the operation of the described device is satisfactory in all voltage configurations of the various terminals and during usual operations, there sometimes occur incidents when the current through one the triacs exceeds a given threshold. Similar problems have been acknowledged in the assemblies of FIGS. 1 and 2, and others. More specifically, in the case of FIG. 1, if a high current flows through diode D1, a leakage current can appear in the adjacent structure and this current, if it is high enough, is likely to trigger thyristor Th1; in the case of FIG. 2, if a high current flows through diode D2, thyristor Th2 is capable of being triggered; and in the case of FIG. 3, if a high current flows through thyristor Th3, thyristor Th5 is capable of being triggered.

Figure 4:
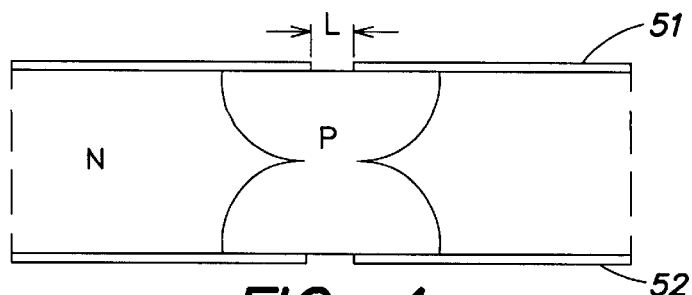
FIG. 4 shows the shape of an insulating wall according to a first state of the art.

FIG. 4 illustrates a conventional insulating wall. This wall is formed from masks 51 and 52 formed on the upper and lower surfaces of a substrate 11, by implantation of a P-type doping and anneal, or by anneal under a doping atmosphere. In both cases, if the silicon wafer has a thickness on the order of 200 to 300 $\mu$m, a very long anneal has to be performed, for example of several hundreds of hours, so that the dopants extending by diffusion from the upper and lower surfaces join. Of course, the surface doping level is much greater than the doping level at the location where the upper and lower diffusions join, that is, in the median portion of the insulating wall. To avoid undue increase of the duration of the diffusion step, it is generally stopped when the two diffusions join and this, all the more as there used to be no reason to make this step longer. Then, the dopant concentration at the level of the median portion is generally relatively low, for example, on the order of $10^{15}$ atoms/cm$^3$. The width of the insulating wall in this median portion is then substantially equal to width L of the openings in the masks. Further, in prior art, it is usually desired to reduce as much as possible the size of the insulating walls. Thus, width L is generally chosen to be as small as possible.

French patent application 97/06822 states that, as soon as the current density in a well exceeds a given threshold, its insulating wall is overflowed by the created carriers and carriers will diffuse into the adjacent well where they can create disturbances. Generally speaking, if the carrier density in a well becomes excessive due to the conduction of components contained in this well, the carriers will spread into the neighboring well by crossing the insulating wall in its thinnest and less doped region. In other words, a statically efficient insulating wall can be dynamically inefficient.

Figure 5:
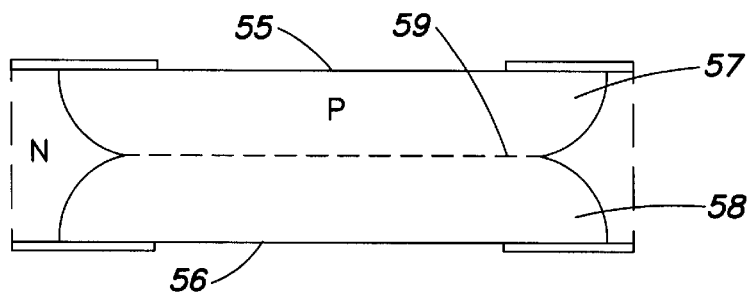
FIG. 5 shows the shape of an insulating wall according to French patent application 97/06822.

The solution provided by French patent application 97/06822 consists of forming insulating walls so that their median portion has a sufficient doping level to form an efficient barrier against the diffusion of electrons from one well to a neighboring well. It is specified that, in practice, when the dopant atom concentration at the level of the median portion of the insulating wall is greater than $10^{16}$ atoms/cm$^3$, problems are avoided in most cases, and it is also provided to act upon the width of the median area of the insulating wall. FIG. 5 illustrates an insulating wall formed in this manner. This wall is made by pursuing the diffusion of doped areas from openings 55 and 56 so that diffused regions 57 and 58 interpenetrate and that the doping level at the level of median line 59 is increased.

This prior solution requires for a wafer of given thickness, increasing the duration of the diffusion anneal upon formation of the insulating walls and/or to increase the width of the insulating walls. When a high dynamic insulation is desired to be ensured between distinct wells while a high current is likely to flow through one of the wells, this results in insulating walls which can have significant widths, greater than twice the thickness of the semiconductive wafer.

As previously indicated, the present invention aims, one the one hand, at increasing the dynamic insulation efficiency of an insulating wall and, on the other hand, at reducing the necessary width of an insulating wall when the current likely to cross a well is very high.

Figure 6A:
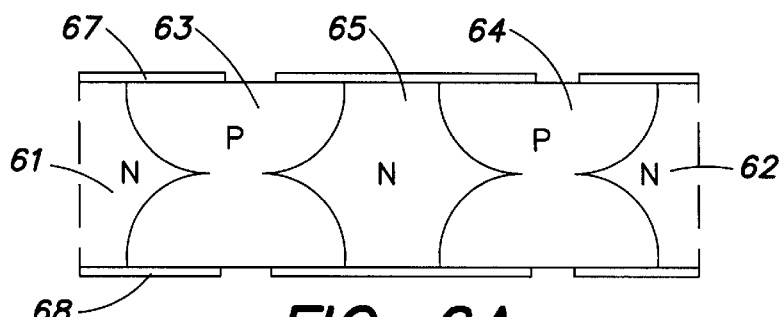
FIGS. 6A and 6B show the shape of an insulating wall according to the present invention.
Figure 6B:
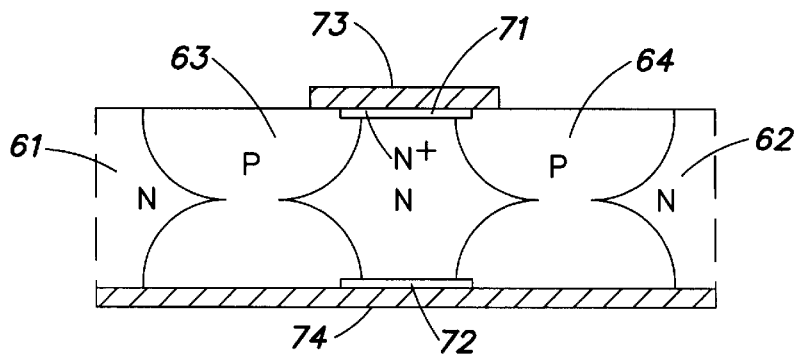

To achieve this object, the present invention provides to form insulating walls in the way illustrated in FIGS. 6A and 6B.

FIG. 6A shows a portion of a semiconductive wafer, the left-hand portion of which is designated by reference 61 and the right-hand portion of which is designated by reference 62. These right-hand and left-hand portions will each correspond to a well in which a high voltage or high current power component is likely to be formed. According to the present invention, the insulating wall is formed of two elementary insulating walls, respectively 63 and 64, separated by a portion 65 of the semiconductor substrate. FIG. 6A indicates how these elementary insulating walls are formed, in a conventional manner similar to that described in relation with FIG. 4 through openings made in masks 67 and 68 respectively formed on the upper and lower surfaces of the semiconductive wafer.

In a second manufacturing step, illustrated in FIG. 6B, N⁺-type overdoped areas 71 and 72 respectively in contact with region 65 on the upper surface and the lower surface of the semiconductive layer are formed. These areas are contacted by respective metallizations 73 and 74. Metallization 73 is a specific metallization formed on N⁺-type region 71 and preferably on the upper surfaces of walls 63 and 64. Metallization 74 is the metallization which, usually, covers the entire rear surface of a power component. Metallization 74 is meant to be connected to a reference voltage, for example, the ground. Metallization 73 is at the potential of metallization 74 due to their connection by walls 63, 64.

According to the present invention, elementary insulating walls 63 and 64 can have minimum dimensions. They will however be preferably diffused rather deeper than is conventional so that their doping at the level of their median areas exceeds $10^6$ atoms/cm³.

Figure 7:
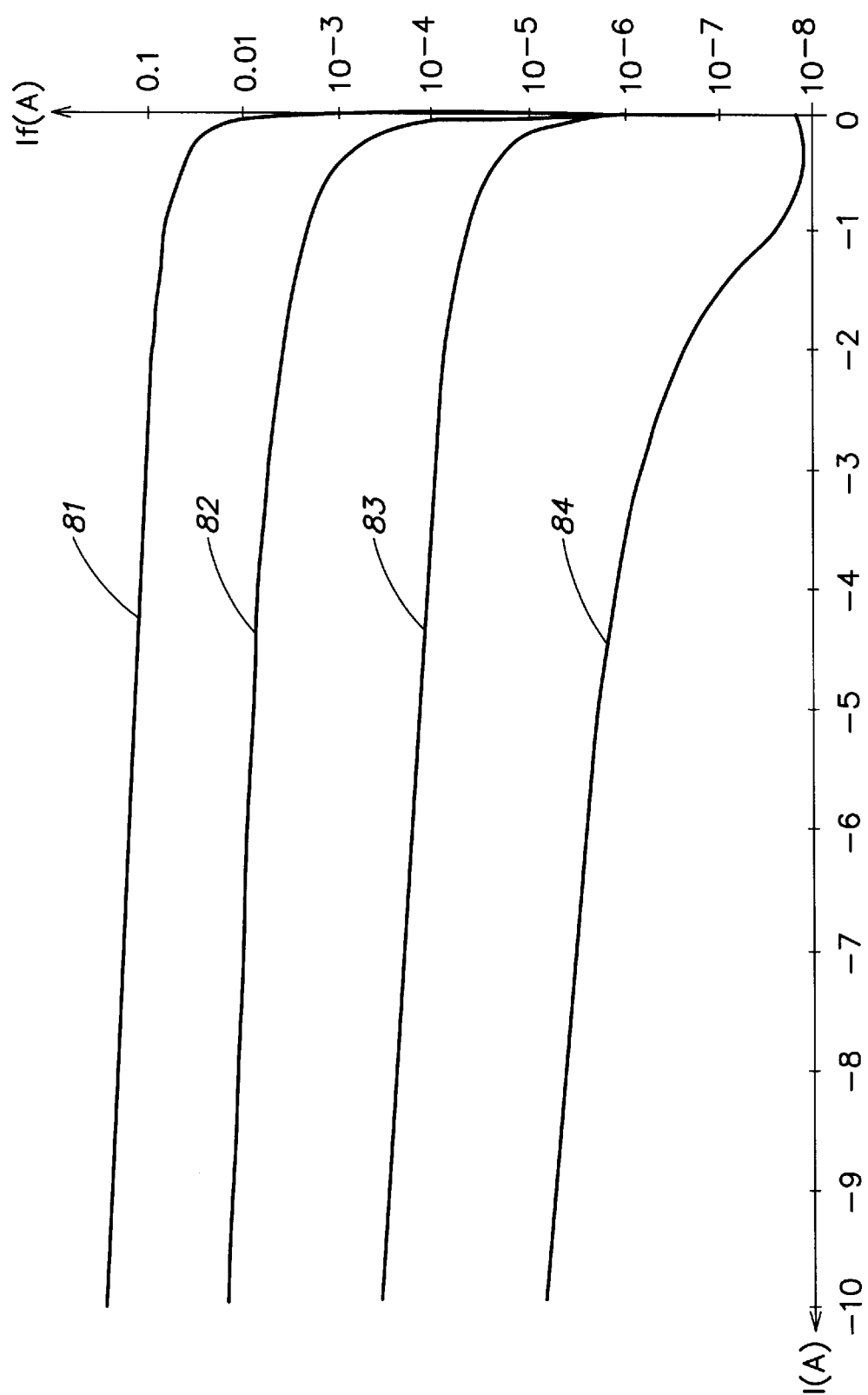
FIG. 7 illustrates the leakage current of a well for various types of insulating walls.

The characteristics of a structure according to the present invention have been compared to the characteristics of a conventional structure, by measuring the leakage current in a well adjacent to a well in which an intense current of determined amplitude has been made to flow. In FIG. 7, current I in the first well is indicated in linear coordinates between values of 0 and −10 amperes (the current is indicated negatively since it flows out of the structure). The leakage current If collected in a neighboring well has been indicated in ordinates, in logarithmic coordinates.

Curve 81 corresponds to a structure of the type of that in FIG. 4 in which the width of the openings in masks 51 and 52 is on the order of 100 μm and in which the dopant atom concentration at the median level of the wall is on the order of $5.10^{14}$ at/cm³. It can be seen that, as soon as the current in the first well exceeds a value on the order of 1 A, the leakage current reaches a value on the order of 0.1 A.

Curve 82 corresponds to the case of a well according to French patent application 9706822 in which the width of openings 55, 56 is on the order of 200 μm and the concentration at the median level is on the order of $10^{16}$ atoms/cm³. It can be seen that, for currents greater than −2 A in the first well, the leakage current becomes much lower than $10^{-2}$ A.

Curve 83 corresponds to a configuration similar to that of curve 82 but in which the thickness of the openings of diffusion of the insulating wall are on the order of 400 μm. Then, the leakage current is reduced to a value on the order of $10^{-4}$ A.

Curve 84 corresponds to a structure according to the present invention with a double insulating wall in which the openings in the masks meant to form the insulating walls have a width on the order of 50 μm and the distance between the two elementary walls is on the order of 300 μm. Thus, the entire structure has a width substantially identical to that of the structure corresponding to curve 83. A reduction on the order of 100 of the leakage current is acknowledged for values of the current exceeding 4 A, and still greater reductions, over 1000, for low current values.

The present invention thus achieves a reduction of the leakage current and a reduction of the dimension of an insulating wall. Indeed, to obtain the same result as that corresponding to curve 84 with a structure corresponding to curve 83, the width of this latter structure would have to be considerably increased.

The advantages of the double insulating wall of the present invention are attributed to the fact that the electrons coming from a well, for example, well 61, having crossed first insulating wall 63, will be extracted from central region 65 by ground connections 73 and 74. Thus, very few electrons are likely to cross the second portion 64 of the insulating wall.

Of course, the present invention is likely to have various alterations, modifications, and improvements which will readily occur to those skilled in the art, especially as concerns the nature of the components formed in the wells separated by insulating walls and the number of these wells.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An insulating wall separating elementary components formed in different wells of a semiconductor wafer of a first conductivity type, a component located in at least one of the wells being capable of operating with a high current density, the insulating wall including at least two elementary insulating walls of a second conductivity type extending through substantially an entire thickness of the semiconductor wafer and separated by a portion of the wafer material that contains no active components, wherein, in operation, said portion is connected to a reference potential.

2. The insulating wall of claim 1, formed by a process that includes a step of forming dopant diffusions into an upper and a lower substrate surface of the semiconductor wafer, through openings having a width that is smaller than a half-thickness of the semiconductor wafer.

3. The insulating wall of claim 1, applied to separating two wells conataining vertical triacs.

4. The insulating wall of claim 1, applied to separating two wells, at least one of the wells including a diode, a thyristor or a vertical triac.

5. The insulating wall of claim 1, wherein the elementary components are of a vertical type and the semiconductor wafer includes a single rear surface metallization.

6. An insulating wall separating elementary components formed in separate wells of a semiconductor wafer of one conductivity type, the insulating wall including at least two insulating regions of another conductivity type extending throughout substantially an entire thickness of the semiconductor wafer and separated by a portion of the semiconductor wafer, wherein the portion of the semiconductor wafer separating the at least two insulating regions contains no elementary active components, and is, in operation, connected to a reference potential.

7. An insulating wall separating elementary components formed in separate wells of a semiconductor wafer of a first conductivity type, the insulating wall comprising at least two insulating regions of a second conductivity type separated by a portion of the semiconductor wafer, said at least two insulating regions extending from an upper surface of the semiconductor wafer to a lower surface of the semiconductor wafer, and not coupled together by any semiconductor material of the second conductivity type, and wherein the portion of the semiconductor wafer is, in operation, connected to a reference potential, and wherein there is no active device located in the portion of the semiconductor wafer.

8. The insulating wall of claim 7, wherein the semiconductor wafer of the first conductivity type is N-type material and the insulating regions of the second conductivity type are P-type material.

9. The insulating wall of claim 7, wherein the semiconductor wafer of the first conductivity type is P-type material and the insulating regions of the second conductivity type are N-type material.

10. The insulating wall of claim 7, wherein at least one of the elementary components is a component capable of operating with a high current density.

* * * * *

UNITED STATES PATENT AND TRADEMARK OFFICE
CERTIFICATE OF CORRECTION

PATENT NO.    : 6,559,515 B1
DATED         : May 6, 2003
INVENTOR(S)   : Franck Duclos It is certified that error appears in the above-identified patent and that said Letters Patent is hereby corrected as shown below:

Column 6,
Lines 63-64, Claim 3 should read as shown below:

-- The insulating wall of claim 1, applied to separating two wells containing vertical triacs. --

Signed and Sealed this

Second Day of September, 2003

JAMES E. ROGAN
*Director of the United States Patent and Trademark Office*